(12) United States Patent
Quardt et al.

(10) Patent No.: US 6,679,646 B2
(45) Date of Patent: Jan. 20, 2004

(54) ELECTRONIC HOUSING SYSTEM

(75) Inventors: Dirk Quardt, Iserlohn (DE); Jörg Söfker, Lemgo (DE); Reinhard Gottlieb Starzinger, Schörfling a.A. (AT); Hans Peter Wintersteiger, Hagenberg (AT)

(73) Assignees: Phoenix Contact GmbH & Co. KG, Blonberg (DE); Keba AG, Linz (AT)

( * ) Notice: Subject to any disclaimer, the term of this patent is extended or adjusted under 35 U.S.C. 154(b) by 149 days.

(21) Appl. No.: 09/994,920

(22) Filed: Nov. 28, 2001

(65) Prior Publication Data

US 2002/0114665 A1 Aug. 22, 2002

(51) Int. Cl.$^7$ ............................ F16B 17/00; F16B 12/00
(52) U.S. Cl. .................... 403/348; 403/408.1; 403/350; 24/DIG. 44; 24/573.11; 24/573.09; 411/349; 411/549; 361/729; 312/223.2; 312/111
(58) Field of Search .................... 24/27, 287, 522, 24/523, 526, 527, 573.09, 573.11, DIG. 44; 361/724, 729; 411/349, 549, 510, 508; 403/348, 350, 408.1; 312/111, 140, 223.2

(56) References Cited

U.S. PATENT DOCUMENTS

| | | | | |
|---|---|---|---|---|
| 3,995,923 A | * | 12/1976 | Shell | 312/111 |
| 4,456,130 A | * | 6/1984 | Possati | 211/26 |
| 4,551,110 A | * | 11/1985 | Selvage et al. | 446/118 |
| 5,275,029 A | * | 1/1994 | Myers | 70/128 |
| 5,788,347 A | * | 8/1998 | Rabinovitz | 312/111 |
| 5,803,689 A | * | 9/1998 | Magnus et al. | 411/355 |

FOREIGN PATENT DOCUMENTS

DE    1 871 657    5/1963

* cited by examiner

Primary Examiner—Robert J. Sandy
(74) Attorney, Agent, or Firm—Nixon Peabody LLP; David S. Safran

(57) ABSTRACT

An electronic housing system is provided which includes at least two, especially plate shaped, electronic housings which can be snapped onto a mounting rail. The housing system includes a locking system including at least two housing portions, namely a starter unit and an end unit, and a key element. The starter unit is constructed as a key receptacle and the end unit is constructed as a lock complementary to the key element. The two housing portions can be locked with one another by rotation of the key element in the end unit. The locking system further includes an intermediate housing portion for positioning between the starter unit and the end unit, whereby the intermediate portion has an intermediate end unit for interlocking with the end of the key element, and an intermediate starter unit.

13 Claims, 4 Drawing Sheets

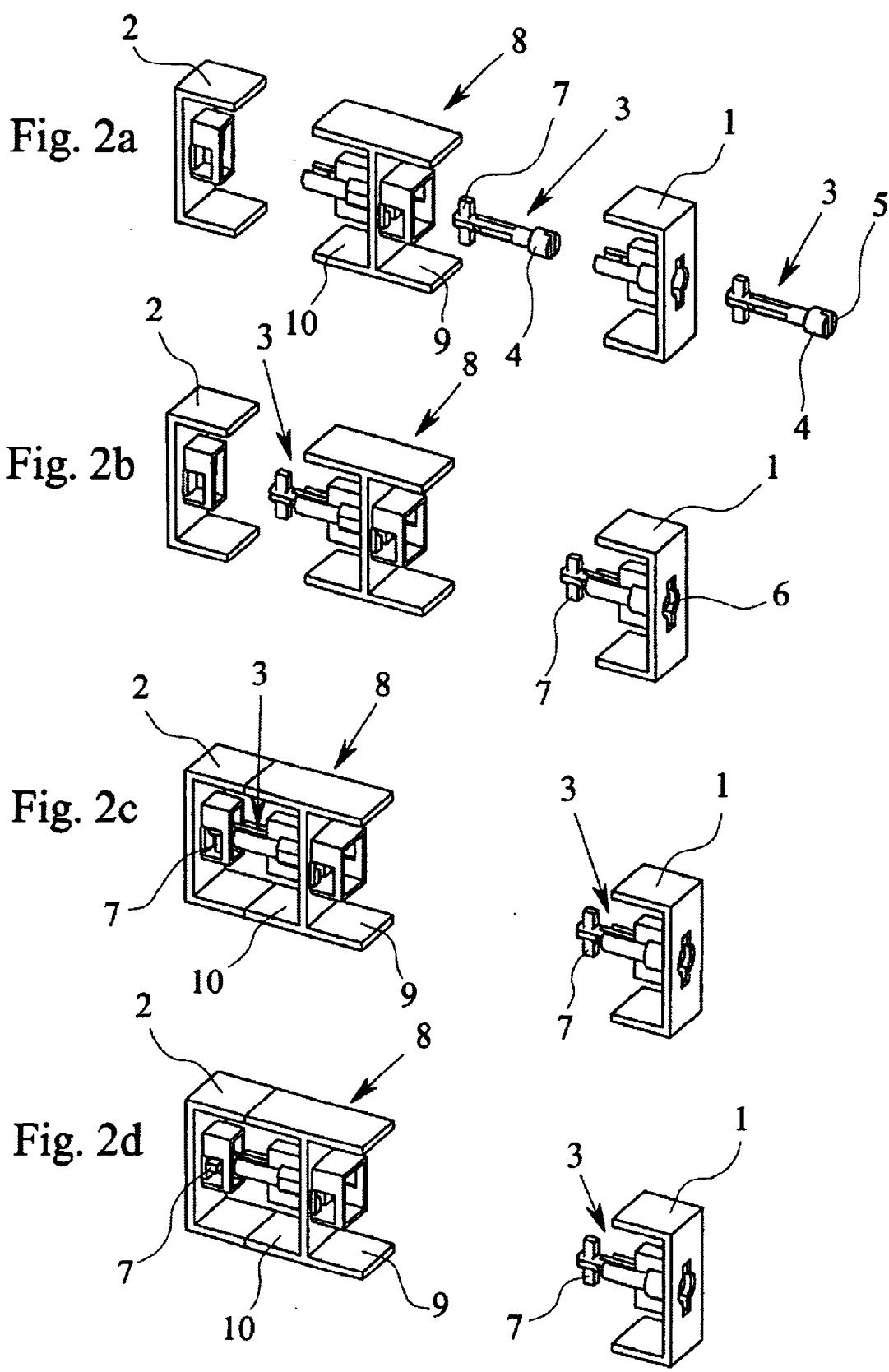

ELECTRONIC HOUSING SYSTEM

BACKGROUND OF THE INVENTION

1. Field of the Invention

The invention relates to an electronic housing system with at least two electronic housings which can be snapped onto a mounting rail.

2. Description of the Related Art

In view of the trend to decentralization of electronics directly into the process and the miniaturization of electronics components into compact, installation-friendly devices, more and more suitable electronics housings are needed, whereby the connection technology is generally also integrated into the housing. The individual housings are then preferably snapped onto a mounting rail and connected with one another and a control through a bus system.

Depending on the respective application, this then results in a multitude of different housing types which differ in size, construction and function. All these housings are similar in that they contain electronic components, mostly in the form of integrated circuit boards, which are protected by the housing from physical contact and dirt. Such housings are generally of modular construction, whereby the housings are built especially as a kit so that the individual housing components can be quickly and individually assembled into an optimal housing. The housings often consist of a housing top and a housing base, whereby the housing top includes connectors for electrical conductors. The connectors are connected with the housing base through plug-in contacts with the housing base creating the connection to a bus system. However, the electronics housing can also consist of two lateral housing halves which are typically connected through latching elements. The individual housings are thereby constructed to allow several housings to be snapped side by side onto a mounting rail so that several housings together form a housing block. The individual adjacent housings or the individual adjacent electronic apparatus can thereby preferably be electrically contacted with one another.

Upon installation of the individual electronic housings onto the mounting rail, they are often positioned in accordance with their relationship to an individual apparatus or installations, so that individual electronic housing systems are created which correspond to the respective installations or apparatus. The individual neighbouring electronic housings should thereby also be mechanically joinable to a solid block, especially when they are also electrically connected with one another. Such a solid block or electronic housing system wherein the individual electronic housings are mechanically connected with one another, has the further advantage that the electronic housing system as a whole can be snapped onto the mounting rail or lifted off therefrom. For example, if a machine connected to an electronic housing system is to be dismantled and reinstalled at another location, the risk of confusion regarding the assignment of the individual electronic housings is prevented, when the electronic housing system as a whole can be lifted off the mounting rail and snapped back onto another.

In the prior art, the joining of the individual electronic housings into an electronic housing system is carried out by bolting together the individual electronic housings with the help of a correspondingly long bolt and a nut. The electronic housings can also be held together by using a covering hood of corresponding length. However, these approaches have the disadvantage that for electronic housing systems with different numbers of electronic housings different bolts or covering hoods of corresponding length must be used. It is furthermore a disadvantage that when a further electronic housing is to be added, it is no longer possible to fasten the new electronic housing with the same bolt or cover.

German Utility Model DE 18 71 657 U1 discloses an electronic housing system with at least two, especially plate shaped, electronic housings with a locking system, consisting of at least two housing portions, namely a starter unit and an end unit, and a key element. The starter unit is constructed as a key receptacle and the end unit is constructed as a lock complementary to the key element. The two housing portions can be locked with one another by rotation of the key element in the end unit. The starting unit is a guide portion, the end unit is a carrier and the key element is a bolt with a cross pin at one end and a mouth piece at the other end for receiving the cross pin of another key element of equal construction. If several housings are to be linked together with this prior art system, the connection between the housings is achieved by interlocking the bolts of the individual housings, namely by the cross pin of the bolt for one housing interlocking with the mouth piece of the bolt for a subsequent housing. For this, the mouth piece must include a specially machined opening and an undercut groove, and the bolt must further include a spring for axial resilient movement, which renders the overall construction of the key element costly. Furthermore, the provisions of the cross pin and the mouth end with an undercut groove, render the diameter of the key element relatively large.

SUMMARY OF THE INVENTION

It is therefore one object of the present invention to overcome the deficiencies of the prior art and to provide an electronic housing system wherein the locking together of individual electronic housings is as simple and flexible as possible.

The above object and other objects are achieved in accordance with the present invention by providing an electronic housing system with at least two electronic housings and a locking system including at least two housing portions, namely a starter unit and an end unit, and a key element having a head and an end. The starter unit is constructed as a key element receptacle and the end unit is constructed as a lock complementary to the end of the key element for locking together the two housing portions by selective rotation of the key element in the end unit. An intermediate housing portion is provided for positioning between the starter unit and the end unit, whereby the intermediate portion has an intermediate end unit for interlocking with the end of the key element and an intermediate starter unit.

If the electronic housing system consists of two electronic housings, the starter unit of the locking system is found in the one electronic housing and the end unit in the other electronic housing. The two electronic housings can be fastened together by inserting the key element into the starter unit constructed as a key receptacle, subsequently pushing the two electronic housings together, whereby the end of the key element enters the end unit constructed as a lock, and subsequently locking the two electronic housings together by rotation of the key element.

Although the above described locking system is initially principally suited for connecting two electronic housings with one another, it can also be used to lock together two housing halves of a single electronic housing. The starter unit of the locking system is thereby found in the one housing half and the end unit in the other housing half.

According to a preferred embodiment of the invention, the key element includes a cylindrical head with at least one slot for rotational operation. Such a key element can be made relatively small, preferably with a cylindrical head of thread size M3, whereby the key element is nevertheless easily operated, for example, with the tip of a screwdriver, when provided with a slot placed in the cylindrical head. Correspondingly, it can also be achieved by appropriate shaping of the slot such that the key element can only be operated with a special tool, so that unauthorized detachment of an electronic housing system is prevented.

According to a preferred embodiment of the electronic housing system in accordance with the invention, a counter bore is provided in the starter unit for supporting the cylindrical head of the key element. On the one hand, the cylindrical head of the key element can be recessed in the starter unit and, on the other hand, the key element is always inserted into the starter unit sufficiently far such that the end of the key element can engage the end unit. By recessing the cylindrical head of the key element into the starter unit, the electronic housings can be positioned directly adjacent to one another.

The end of the key element is preferably constructed as a key bit, whereby the end unit of the locking system includes a lock complementary to the key bit. Furthermore, a locking of the key element in the end unit in the manner of a bayonet connection is also possible.

The electronic housing system in accordance with the invention is especially preferably adapted for connection of, not only two electronic housings but, several electronic housings with one another. For that purpose, the intermediate portion is inserted between the starter unit and the end unit. The intermediate portion includes an end unit and a starter unit, whereby the end of a first key element locks in the end unit and the cylindrical head of a second key element is recessed in the starter unit. The intermediate portion thereby functions as an end unit for the first electronic housing, which includes a starter unit, and as a starter unit for the second electronic housing which includes the end unit. With such a construction of the intermediate portion, it is possible to connect any number of intermediate portions in series, whereby the individual intermediate portions, and thereby the individual electronic housings, are respectively mechanically connected with one another by identical key elements. A cascading locking of any number of electronic housings to an electronic housing system is thereby possible. Thus, an existing electronic housing system can be shortened or expanded by one electronic housing at a time. Furthermore, the remaining electronic housings in a housing system remain fastened to one another even upon detachment of one electronic housing from the electronic housing system.

Therefore, any number n of electronic housings can be connected in the electronic housing system in accordance with the invention in that the locking system consists of a starter unit, an end unit, n-2 intermediate portions and n-1 key elements. Preferably, the starter unit, the end unit or an intermediate portion are respectively located in a corner of an electronic housing and constructed integral therewith. If an especially safe connection of several electronic housings to an electronic housing system is to be guaranteed, at least two corners of each electronic housing include a starter unit, an end unit or an intermediate portion respectively.

BRIEF DESCRIPTION OF THE DRAWINGS

FIGS. 2a–2d show four different locking steps of another embodiment of a locking system according to the present invention and including three housing portions;

DETAILED DESCRIPTION OF THE INVENTION

Figure 1A:
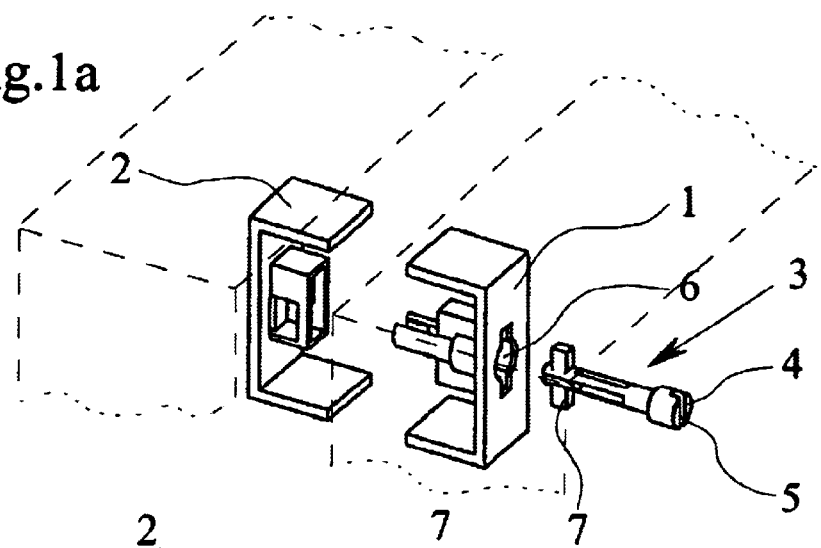
FIGS. 1a–1d show four different locking steps of a locking system for an electronic housing system with only two housing portions in accordance with one embodiment of the present invention.

The Figures primarily illustrate the actual locking system consisting of at least two housing portions which themselves are respectively part of an electronic housing. An electronic housing is shown in dashed lines and contains a housing portion of the locking system. Although only a single electronic housing is shown, it should be understood that a respective electronic housing is associated with each housing portion of the locking system in each of the Figures. The embodiments illustrated in FIGS. 1a–3b of the locking system in accordance with the present invention are distinguished from one another in that a different number of electronic housings can be locked together with the help of the locking system of the invention to form an electronic housing system.

The locking system illustrated in Fig. 1a–1d consists of only two housing portions, namely a starter unit 1 and an end unit 2. Thus, only two electronic housings can be locked together with this locking system. The locking system further includes a key element 3. The key element 3 can be inserted into the starter unit 1, which is constructed as a key receptacle, and locked by rotation in the end unit 2, which is constructed as a lock.

The key element 3 includes a cylindrical head 4 with a slit 5 for rotational operation of the key element 3. By constructing the one end of the key element 3 as a cylindrical head and positioning a slot 5 in the cylindrical head 4, the key element can be constructed as a very small element. For example, the cylindrical head 4 can have a thread size of only M3. By positioning the slot 5 in the cylindrical head 4, the key element 3 is still easily operated even at such a small size, for example, with the help of the tip of a screwdriver.

Furthermore, the possibility exists to completely recess the key element 3 with its cylindrical head 4 into the starter unit 1. A counterbore 6 is therefor formed in the starter unit 1, which also serves to support the cylindrical head 4 of the key element 3. The other end of the key element 3 is constructed as a key bit 7, so that the key element 3 can be locked in the end unit 2 by a simple rotation, for example, by 90°.

Figure 1B:
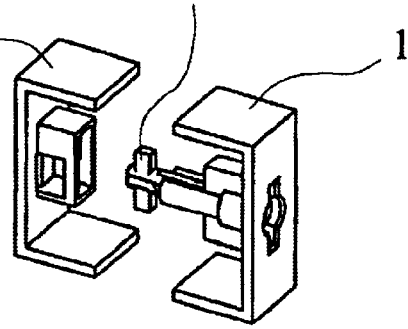
Figure 1C:
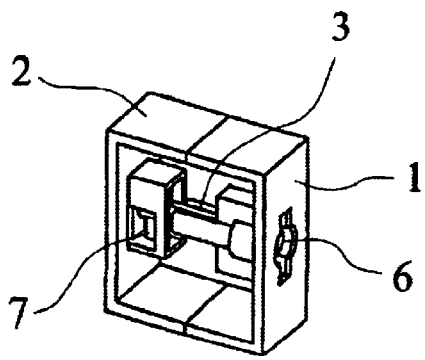
Figure 1D:
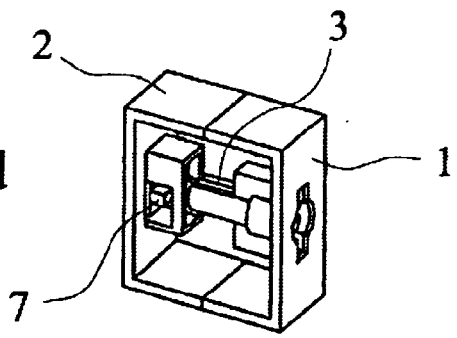

The individual locking steps of the locking system are easily apparent from FIGS. 1a–1b. According to FIG. 1a, the starter unit 1, the end unit 2 and the key element 3 are initially completely separate from one another, which means a first electronic housing in which the starter unit 1 is positioned, and a second electronic housing in which the end unit 2 is positioned are not yet connected with one another. In a first locking step, as illustrated in FIG. 1b, the key element 3 is now inserted into the starter unit 1. The key bit 7 of the key element 3 is thereby in a vertical position.

Hence, the key element 3 is completely inserted into the starter unit 1, and the cylindrical head 4 of the key element 3 is completely recessed in and supported inside the starter unit 1 by the counterbore 6. In a third step, the starter unit 1 and the end unit 2, which also means the first electronic housing and the second electronic housing attached thereto, respectively, are pushed together so that the key bit 7 of the key element 3 engages the end unit 2 which is constructed as a complementary lock. The starter unit 1 and the end unit 2 are now fit together (FIG. 1c), but are not yet locked to one another, so that the two electronic housings are also not yet locked together. In a last locking step, the key bit 7 of the key element 3 is now rotated by 90°, whereby the key bit 7 is positioned in the end unit 2 in such a way that the key element 3 can no longer be pulled out therefrom. Since the cylindrical head 4 of the key element 3 also rests in the counterbore 6 of the starter unit 1, the starter unit 1 is now interlocked with the end unit 2.

The locking system in accordance with the invention illustrated in FIGS. 2a–2d is differentiated from the above described locking system according to FIGS. 1a–1d in that it consists of three housing portions, namely a starter unit 1, an end unit 2 and an additional intermediate portion 8. Three electronic housings can therefore be locked together to an electronic housing system with the locking system illustrated in FIGS. 2a–2d. The intermediate portion 8 is constructed in such a way that it consists of an intermediate end unit 9 and an intermediate starter unit 10, whereby the cylindrical head 4 of a first key element 3 can be recessed in the intermediate starter unit 10 and the key bit 7 of a second key element 3 can be locked in the intermediate end unit 9. The intermediate end unit 9 of the intermediate portion 8 is thereby constructed exactly the same as the separate end unit 2. The intermediate starter unit 10 of the intermediate portion 8 is also constructed the same as the separate starter unit 1 and therefore likewise includes a counterbore 6 for receiving the cylindrical head 4 of the key element 3. As is apparent from a comparison of FIGS. 1 and 2, the starter unit 1 can be connected directly with the end unit 2 or through the insertion of the intermediate portion 8.

FIGS. 2a–2d show different locking steps similar to FIGS. 1a–1d. The intermediate portion 8 is initially interlocked with the end unit 2, whereby a first key element 3 is inserted through the intermediate end unit 9 into an intermediate starter unit 10 until the cylindrical head 4 of the key element 3 rests in the counterbore 6 in the intermediate starter unit 10 (FIG. 2b). Subsequently, the intermediate portion 8 and the end unit 2 are pushed together (FIG. 2c) and then the intermediate portion 8 is interlocked with the end unit 2 in that the key bit 7 of the first key element 3 is rotated by about 90° (FIG. 2d). As the last step, the starter unit 1 is then connected with the intermediate portion 8, whereby initially a second key element 3 is inserted into the starter unit 1 and subsequently the starter unit 1 is fitted together with the intermediate end unit 9 of the intermediate portion 8 and locked thereto by rotation of the key bit 7 of the second key element 3.

It is therefore apparent from FIG. 2 that the locking of the intermediate portion 8 with the end unit 2 or of the starter unit 1 with the intermediate portion 8 occurs in the same manner as the locking together of the starter unit 1 and end unit 2 illustrated in FIG. 1. Independently thereof, if only one starter unit 1 and one end unit 2, which means only two electronic housings, are to be connected with one another, or if a starter unit 1, an intermediate portion 8 and an end unit 2, which means 3 electronic housings are to be connected with one another, the same key elements 3 are respectively needed, whereby in the first case only one key element 3 is needed and two key elements 3 in the second case.

Figure 3A:
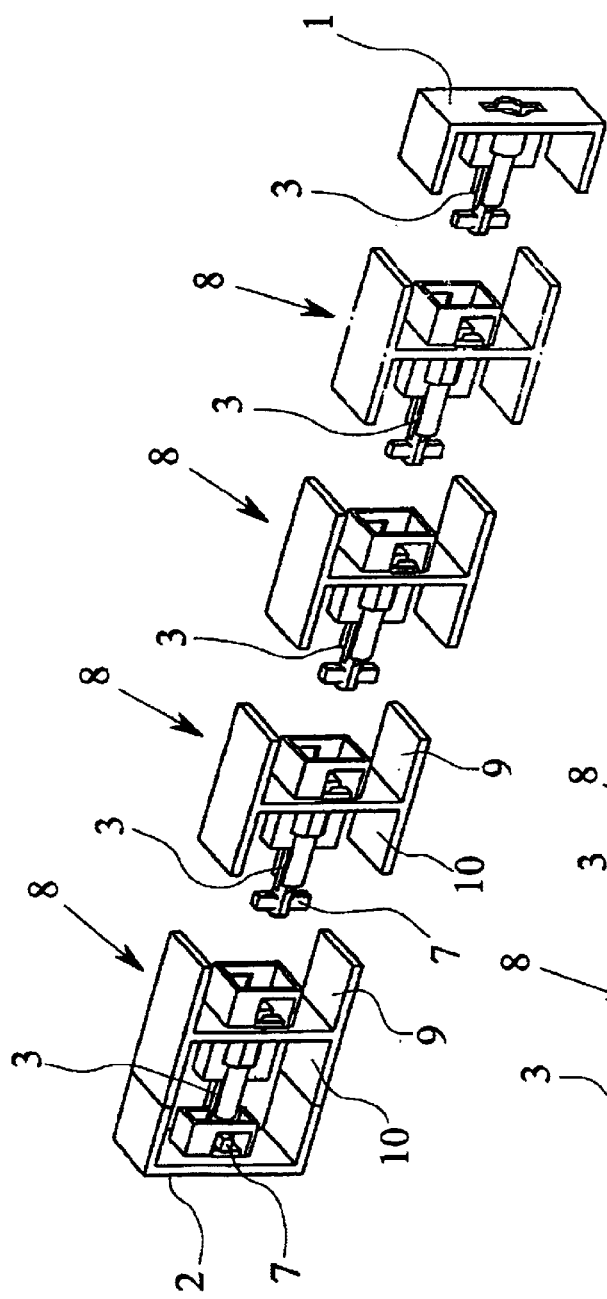
FIGS. 3a and 3b show yet another embodiment of the locking system in accordance with the present invention including an electronic housing with six housing portions in two different locking conditions.
Figure 3B:
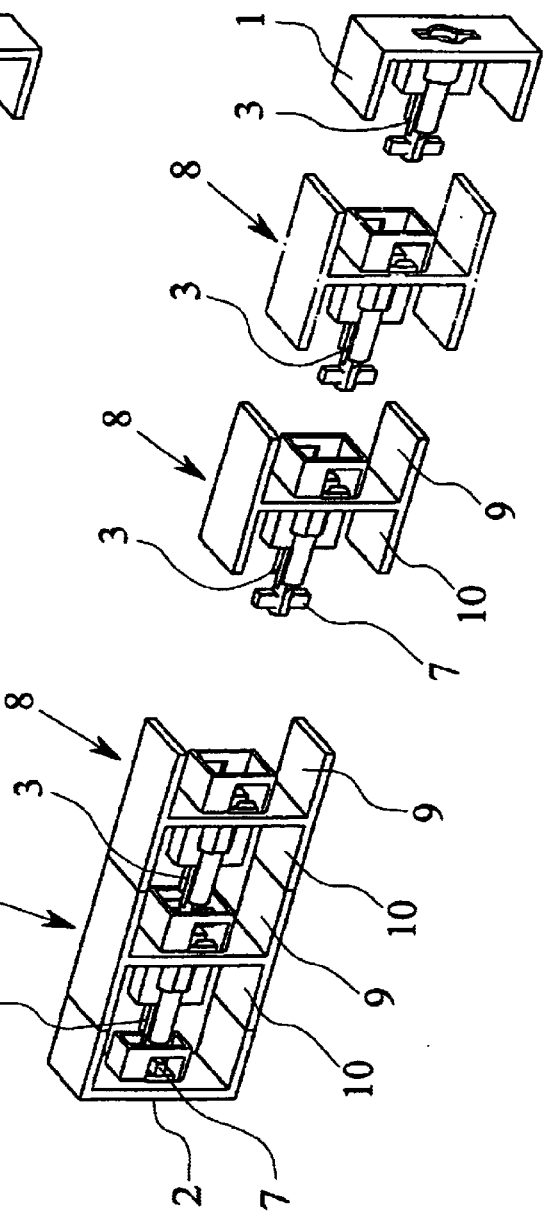

FIGS. 3a and 3b show a further exemplary embodiment of a locking system for locking together a total of six electronic housings, of which one electronic housing includes a starter unit 1, another one an end unit 2 and four electronic housings each include an intermediate portion 8. The locking together of such an electronic housing system with the help of such a locking system now again occurs step-wise so that initially the end unit 2 is locked to the first intermediate portion 8 (illustrated all the way to the left in FIG. 3). A first key element 3 is therefor inserted into the intermediate starter unit 9 of the first intermediate portion 8 and, after fitting together the end unit 2 with the first intermediate portion 8, the key bit 7 of the key element 3 is locked in the end unit 2 by a rotation of about 90°. Next, a second intermediate portion 8 is then locked with the first intermediate portion 8, whereby then a second key element 3 holds the intermediate starter unit 10 of the second intermediate portion 8 to the intermediate end unit 9 of the first intermediate portion 8. Correspondingly, the third intermediate portion 8 is subsequently connected with the second intermediate portion 8 and the fourth intermediate portion 8 with the third intermediate portion 8. In the last step, the starter unit 1 is then locked to the fourth intermediate portion 8.

Figure 4A:
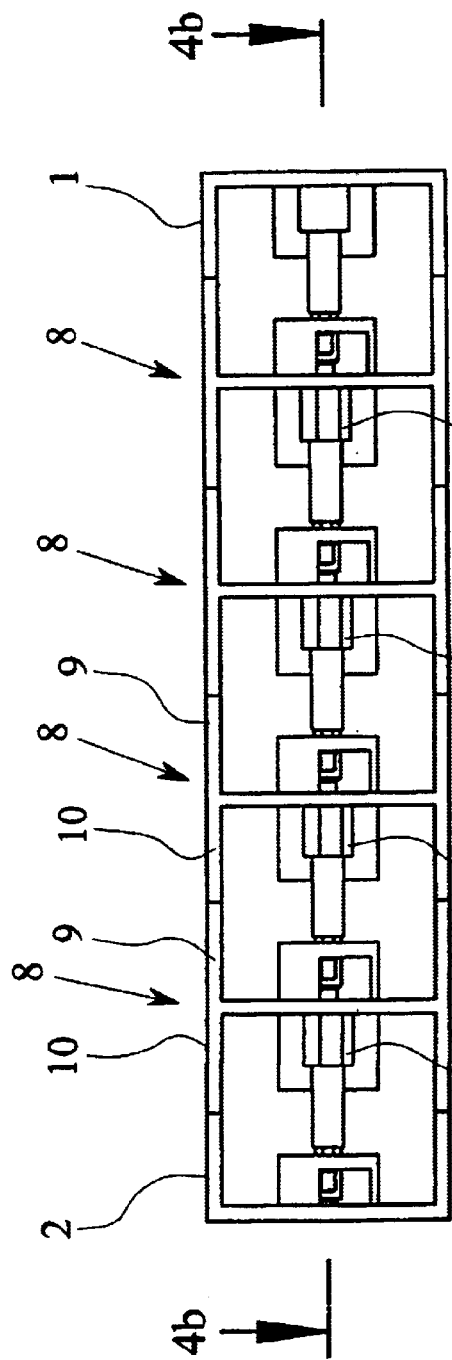
FIGS. 4a and 4b are a side view and a cross-sectional view, respectively, of an embodiment of the locking system in accordance with the invention for an electronic housing system according to FIG. 3 in the completely locked condition.
Figure 4B:
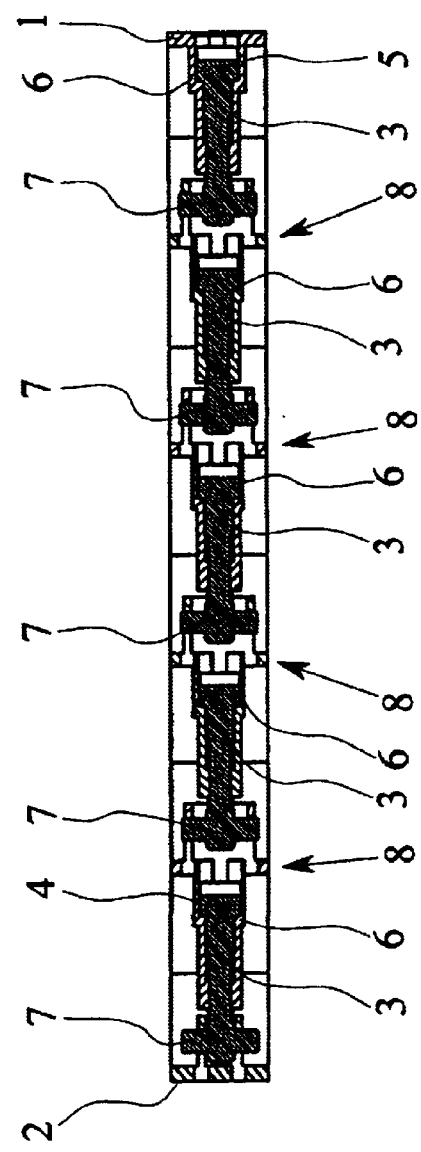

The fourth intermediate portion 8 is illustrated in broken lines in FIG. 4 in order to indicate that the locking system can be complemented by further intermediate portions 8. A cascading locking of any number of electronic housings to an electronic housing system is therefore possible with the locking system in accordance with the present invention, whereby the number of electronic housings connected with one another can be increased or reduced at any time. Thus, any number (n) of electronic housings can be mechanically rigidly connected with one another by the locking system, whereby the locking system includes one starter unit 1 and one end unit 2, n–2 intermediate portions 8 and n–1 key elements 3. The locking system in accordance with the present invention can be especially easily manufactured in that the individual intermediate portions 8 as well as the individual key elements 3 are identically constructed, independent from the number of the electronic housings to be locked together. Since each of the intermediate portions 8 respectively includes an intermediate end unit 9 and an intermediate starter unit 10, it is furthermore also possible to lock together any number of electronic housings to an electronic housing system, whereby each electronic housing is of identical construction, and respectively includes at least one intermediate portion 8. In such an electronic housing system, the intermediate starter unit 10 of the first intermediate portion 8 and the intermediate end unit 9 of the last intermediate portion 8 would then not be used. A separate starter unit 1 and a separate end unit 2 are then no longer necessary.

We claim:

1. An electronic housing system for interconnecting at least two electronic housings, comprising:
   a locking system including a plurality of housing portions including a starter unit for one of the electronic housings and an end unit for another electronic housing, said locking system further including at least one key element having a head and an end, the starter unit being constructed as a key element receptacle and the end unit being constructed as a lock complementary to the end of the key element for locking the two housing portions together by selective rotation of the key element in the end unit, said plurality of housing portions further including an intermediate housing portion for positioning between the starter unit and the end unit, whereby the intermediate portion includes an intermediate end unit and an intermediate starter unit, the intermediate end unit for interlocking with the end of the key element.

2. The system of claim 1, wherein the key element includes a cylindrical head with at least one slot for rotational operation of the key element.

3. The system of claim 2, wherein at least one of the starter unit and the intermediate starter unit include means for recessing the cylindrical head of the key element.

4. The system of claim 2, wherein at least one of the starter unit and the intermediate starter unit includes a counter bore for receiving and supporting the cylindrical head of the key element.

5. The system of claim 1, wherein the end of the key element is constructed as a key bit.

6. The system of claim 4, wherein the end of the key element is constructed as a key bit.

7. The system of claim 1, wherein the intermediate end unit is constructed for locking with the end of a first key element and the intermediate starter unit is constructed for receiving the cylindrical head of a second key element.

8. The system of claim 1, wherein the locking system includes n electronic housings, a starter unit, an end unit, n–2 intermediate portions and n–1 key elements.

9. The system of claim 7, wherein the locking system includes n electronic housings, a starter unit, an end unit, n–2 intermediate portions and n–1 key elements.

10. The system of claim 1, wherein one of the starter unit, the end unit and the intermediate portion are positioned in one corner of at least one of the electronic housings, said one being constructed integral with said at least one of the electronic housings.

11. The system of claim 9, wherein respectively one of the starter unit, the end unit and the intermediate portion are positioned in one corner of a respective electronic housing, said one being constructed integral with the electronic housing.

12. The system of claim 1, wherein each of at least one of several starter units, several end units and several intermediate portions are part of a respective one of the electronic housings, and are positioned such that, in at least two corners of the electronic housing, one of a starter unit, an end unit and an intermediate portion are positioned.

13. The system of claim 1, wherein the at least two electronic housings are constructed for snapping onto a mounting rail.

* * * * *